United States Patent
Gruner et al.

(10) Patent No.: US 12,271,117 B2
(45) Date of Patent: Apr. 8, 2025

(54) SUPPORT FOR AN OPTICAL ELEMENT (71) Applicant: Carl Zeiss SMT GmbH, Oberkochen (DE)

(72) Inventors: Toralf Gruner, Aalen-Hofen (DE); Joachim Hartjes, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 198 days.

(21) Appl. No.: 18/296,186

(22) Filed: Apr. 5, 2023

(65) Prior Publication Data

US 2023/0236516 A1  Jul. 27, 2023

Related U.S. Application Data

(63) Continuation of application No. PCT/EP2021/078156, filed on Oct. 12, 2021.

(30) Foreign Application Priority Data

Oct. 14, 2020  (DE) .......................... 102020212927.4

(51) Int. Cl.
*G03F 7/20* (2006.01)
*G03F 7/00* (2006.01)

(52) U.S. Cl.
CPC ...... *G03F 7/70725* (2013.01); *G03F 7/70758* (2013.01); *G03F 7/70825* (2013.01)

(58) Field of Classification Search
CPC ............. G03F 7/70725; G03F 7/70758; G03F 7/70825; G03F 7/70258; G02B 7/185
See application file for complete search history.

(56) References Cited

U.S. PATENT DOCUMENTS 6,573,978 B1  6/2003  McGuire, Jr.
7,760,327 B2  7/2010  Scherle et al.
(Continued)

FOREIGN PATENT DOCUMENTS

DE  196 28 672 A1  1/1998
DE  101 51 919 A1  5/2003
(Continued)

OTHER PUBLICATIONS

Translation of International Preliminary Report on Patentability for corresponding PCT Appl No. PCT/EP2021/078156, dated Apr. 27, 2023.
(Continued)

*Primary Examiner* — Mesfin T Asfaw
(74) *Attorney, Agent, or Firm* — Fish & Richardson P.C.

(57) ABSTRACT

An optical assembly of a microlithography imaging device comprises a holding device for holding an optical element. The holding device has a holding element having first and second interface sections. The first interface section for a first interface connecting the holding element and the optical element in an installed state. The second interface section forms a second interface connecting the holding element and a support unit in the installed state. The support unit connects the optical element to a support structure to support the optical element on the support structure via a supporting force. The holding device comprises an actuator device engaging on the holding element between the first and second interfaces. The actuator device acts on the holding element via a controller so that a specifiable interface deformation and/or a specifiable interface force distribution acting on the optical element is set on the first interface.

20 Claims, 2 Drawing Sheets

(56) References Cited

U.S. PATENT DOCUMENTS

| | | |
|---|---|---|
| 2006/0132747 A1 | 6/2006 | Singer et al. |
| 2009/0207511 A1 | 8/2009 | Schoeppach et al. |
| 2014/0125995 A1 | 5/2014 | Schoeppach et al. |

FOREIGN PATENT DOCUMENTS

| | | |
|---|---|---|
| DE | 10 2008 009 600 A1 | 8/2009 |
| DE | 10 2011 075 316 A1 | 11/2012 |
| DE | 10 2015 223 518 A1 | 5/2017 |
| DE | 10 2017 207 433 A1 | 4/2018 |
| DE | 10 2018 207 454 A1 | 5/2019 |
| EP | 1 614 008 B1 | 1/2006 |
| WO | WO 2008/122313 A1 | 10/2008 |
| WO | WO 2010/007036 A2 | 1/2010 |

OTHER PUBLICATIONS

German Office Action, with translation thereof, for corresponding DE Appl No. 10 2020 212 927.4, dated May 31, 2021.
Translation of International Search Report for corresponding PCT Appl No. PCT/EP2021/078156, dated Feb. 3, 2022.

SUPPORT FOR AN OPTICAL ELEMENT

CROSS-REFERENCE TO RELATED APPLICATIONS

The present application is a continuation of, and claims benefit under 35 USC 120 to, international application PCT/EP2021/078156, filed Oct. 12, 2021, which claims benefit under 35 USC 119 of German Application No. 10 2020 212 927.4, filed Oct. 14, 2020. The entire disclosure of each of these applications is incorporated by reference herein.

FIELD

The present disclosure relates to a microlithographic optical arrangement suitable for utilizing UV used light, particularly light in the extreme ultraviolet (EUV) range. Furthermore, the disclosure relates to an optical imaging device comprising such an arrangement. The disclosure can be used in conjunction with any desired optical imaging methods. It can be used in the production or the inspection of microelectronic circuits and the optical components used for them (for example optical masks).

BACKGROUND

The optical devices used in conjunction with the production of microelectronic circuits typically comprise a plurality of optical element units comprising one or more optical elements, such as lens elements, mirrors or optical gratings, which are arranged in the imaging light path. The optical elements typically cooperate in an imaging process in order to transfer an image of an object (for example a pattern formed on a mask) to a substrate (for example a so-called wafer). The optical elements are typically combined in one or more functional groups, which are possibly held in separate imaging units. In particular in the case of principally refractive systems that operate with a wavelength in the so-called vacuum ultraviolet range (VUV, for example at a wavelength of 193 nm), such imaging units are often formed from a stack of optical modules holding one or more optical elements. The optical modules typically comprise a support structure having a substantially ring-shaped outer support unit, which supports one or more optical element holders, which in turn hold the optical element.

The ever-advancing miniaturization of semiconductor components can result in a demand for increased resolution of the optical systems used for their production. This demand for increased resolution can result in an increased numerical aperture (NA) and an increased imaging accuracy of the optical systems.

One approach for obtaining an increased optical resolution is to reduce the wavelength of the light used in the imaging process. The trend in recent years has increasingly fostered the development of systems in which light in the so-called extreme ultraviolet (EUV) range is used, typically at wavelengths of 5 nm to 20 nm, in most cases at a wavelength of approximately 13 nm. In this EUV range, it is, in general, no longer possible to use conventional refractive optical systems. This is owing to the fact that in this EUV range the materials used for refractive optical systems generally have an absorbance that is too high to achieve acceptable imaging results with the available light power. Consequently, in this EUV range, it is generally the case that reflective optical systems are used for imaging.

This transition to purely reflective optical systems having a high numerical aperture (e.g., NA>0.4) in the EUV range can result in considerable challenges with regard to the design of the imaging device.

The factors mentioned above can result in relatively stringent desired properties with regard to the position and/or orientation of the optical elements participating in the imaging relative to one another and also with regard to the deformation of the individual optical elements in order to achieve a desired imaging accuracy. Moreover, it can be desirable to maintain this high imaging accuracy over operation in its entirety, ultimately over the lifetime of the system.

As a consequence, the components of the optical imaging device (i.e., for example, the optical elements of the illumination device, the mask, the optical elements of the projection device and the substrate) which cooperate during the imaging may have to be supported in a well-defined manner in order to maintain a predetermined well-defined spatial relationship between these components and to obtain a minimal undesired deformation of these components in order ultimately to achieve the highest possible imaging quality.

An arising here, such as in the aforementioned EUV systems, can be that the illumination device and the projection device and at least some of the individual optical elements are comparatively large and heavy optical units on account of the system. However, in order to meet certain desired accuracy properties, it can be desirable for these heavy units to be exchangeable and correspondingly adjustable and, moreover, not experience unwanted or not accurately defined deformations already on account of the design of their mount. For these reasons, use is typically made of a so-called three-point bearing by way of three detachable holding units, which are uniformly distributed along the circumference (the holding units typically being designed in the form of so-called hexapod kinematics), for the purposes of bearing these optical units or elements, as is known, e.g., from U.S. Pat. No. 7,760,327 B2 (Scherle et al., the entire disclosure of which is incorporated herein by reference).

Such a three-point bearing can allow a statically determined mount to be obtained or a statically overdetermined mount to be avoided in order to avoid unwanted parasitic stresses and deformations in the optical unit arising therefrom, as may occur on account of production inaccuracies or deformations of the support structure.

A potential issue with such a statically determined three-point bearing is that, in general, undesired deformations of the optical element naturally can only be compensated for by way of separate actuators, or desired deformations of the optical element can only be set by way of such separate actuators.

Such deformation actuators typically act kinematically parallel to the actual mount that absorbs the weight of the optical element and can lead to a static overdetermination. The forces and/or moments that are applied to deform the optical element usually have a parasitic influence on the rigid-body pose (i.e., the position and/or orientation) of the optical element in space, which then is in turn corrected, with the result that comparatively complex closed-loop control may be used.

Alternatively, the deformation actuators can exclusively engage on the optical element (for example at different points on the optical element). However, this can lead to a comparatively complex solution in that the energy supply and control of the deformation actuators are designed in a correspondingly complex manner in order to avoid or at least minimize the introduction of parasitic stresses into the optical element through the lines to the deformation actuators.

SUMMARY

The disclosure seeks to provide an improved microlithographic optical arrangement and a corresponding improved optical imaging device having such an arrangement, an improved method for supporting an optical element, and an improved optical imaging method. Optionally, the technology can allow a targeted deformation of the optical element in a relatively simple manner.

The disclosure is based, at least in part, on the technical teaching that a targeted deformation of the optical element is made possible in a simple manner if the devices for generating the deformation of the optical element (i.e., for example, one or more actuator devices) are integrated in the region of the holding elements which form the interfaces between the optical element and the support units, and are therefore arranged kinematically in series between the respective support unit and the optical element in the supporting-force flow. As a result, firstly, forces and/or moments can be introduced into the optical element, which have only a small parasitic influence (if any) on the rigid-body pose of the optical element in space. In addition, this integration of the devices for generating the deformation in the region of the holding elements can make it possible to make the energy supply and control of these devices correspondingly simple (for example, to integrate or arrange them in the region of the support units) without increasing the risk of introducing parasitic stresses into the optical element in this way.

The disclosure is based, for example, on the insight that suitable introduction of deforming forces and/or moments into the optical element in the region of the respective interface between the support units and the optical element already allows the realization of a deformation of the optical element and its optical surface using comparatively small forces and/or moments. In particular, a so-called Z2_3 effect can optionally be achieved by a suitable superposition of forces and/or moments (in particular a linear combination of forces and/or moments), which means that is possible to influence what is known as the Z2_3 field profile and hence the imaging errors of the imaging (which is described in a well-known manner by so-called Zernike functions).

It goes without saying here that, in general, any desired corrections of imaging errors are possible via the deforming forces and/or moments introduced into the optical element. In this way, it is possible to (at least partially) compensate for static imaging errors, which are caused, for example, by the gravitational force acting on the optical element. However, it is likewise possible to (at least partially) compensate for dynamic imaging errors which are caused, for example, by vibrations introduced into the optical element. In particular, it is possible to counteract imaging errors that result from flow-induced vibrations that may occur in cooling systems of the imaging device, in particular in cooling systems for the optical element and/or its surroundings. Effective compensation of the imaging errors can be achieved here via a corresponding control bandwidth for the deforming forces and/or moments introduced into the optical element.

According to one aspect, the disclosure therefore relates to an optical arrangement of a microlithographic imaging device, in particular for using light in the extreme UV (EUV) range, comprising a holding device for holding an optical element. The holding device has at least one holding element, with the holding element having a first interface section and a second interface section. The first interface section forms a first interface via which the at least one holding element, in an assembled state, is connected to the optical element. The second interface section forms a second interface via which the holding element, in the assembled state, is connected to a support unit, in particular an active support unit, which connects the optical element to a support structure for the purpose of supporting the optical element on the support structure by way of a supporting force. The holding device comprises an actuator device, the actuator device engaging with the holding element between the first interface and the second interface. The actuator device is configured to act, under the control of a control device, on the holding element in such a way that a definable interface deformation and/or a definable interface force distribution that acts on the optical element is set at the first interface.

It goes without saying here that the actuator device can be part of the holding element or can be integrated into the holding element. In this case, the actuator device can therefore also be located directly in the supporting-force flow from the support unit in question to the optical element. In particular, the actuator device itself can also form the first and/or second interface in question, for example. However, the actuator device can likewise engage with different parts of the holding element. In this case, the actuator device can also act kinematically in parallel with the (actual) supporting-force flow from the respective support unit to the optical element.

It is also understood that the holding element, by which the optical element is connected to the associated support unit, can in general be designed in any suitable manner in order to form the interfaces between the respective support unit and the optical element. Any desired geometries matched to the optical element and/or the assigned support unit can be used in this case for as long as there is a connection and/or integration of the actuator unit with which the desired forces and/or moments can be introduced into the optical element.

In some variants, the holding element defines a circumferential direction, a radial direction, and an axial direction, the axial direction running perpendicular to a plane defined by the circumferential direction and the radial direction. In these variants, the actuator device is configured to set, under control of the control device and in at least one peripheral region of the holding element a definable radial interface force that acts in the radial direction on the optical element. To this end, the actuator device may comprise one or more actuator units, by which the interface force can be set. The actuator device can comprise at least one actuator unit which is assigned to the at least one peripheral region and is configured to set the radial interface force. Such radial forces can be used to generate desired deformations of the optical element in a particularly simple manner.

In certain variants, the holding element has a plurality of separate peripheral regions, with the actuator device being configured to set, under control of the control device, a definable radial interface force in each of the peripheral regions. In particular, the actuator device in this case can be configured to engage with two peripheral regions (for example, two diametrically opposite peripheral regions) and set the radial interface force on the two peripheral regions by way of the pair of force and reaction force at the two points of engagement. Likewise, the actuator device can be configured, in particular, to set the radial interface forces separately for two of the peripheral regions. A particularly variable influence on the deformation of the optical element is possible in this way.

Furthermore, the actuator device can be configured to set, for two of the peripheral regions, radial interface forces that are at an angle with respect to one another. Likewise, the actuator device can be configured to set, for two of the peripheral regions, radial interface forces that are at least substantially parallel to one another, in particular at least substantially opposite to one another.

In further variants, in which the holding element again defines a circumferential direction, a radial direction, and an axial direction, which runs perpendicular to a plane defined by the circumferential direction and the radial direction, the actuator device is configured to set, under control of the control device and in at least one peripheral region of the holding element, a definable tangential interface force that acts tangentially to the circumferential direction on the optical element. Such tangential forces can likewise be used to generate desired deformations of the optical element in a particularly simple manner. In this case, the actuator device may once again comprise one or more actuator units, by which the interface force can be set. The actuator device can comprise an actuator unit which is assigned to the at least one peripheral region and is configured to set the tangential interface force.

In certain variants, the holding element again has a plurality of separate peripheral regions, with the actuator device then being configured to set, under control of the control device, a definable tangential interface force in each of the peripheral regions. A particularly variable influence on the deformation of the optical element, in turn, is possible in this way. In particular, the actuator device in this case can be configured to engage with two peripheral regions (for example, two directly adjacent peripheral regions) and set the radial interface force on the two peripheral regions by way of the pair of force and reaction force at the two points of engagement. Furthermore, the actuator device can be configured to set the tangential interface forces separately for two of the peripheral regions. A particularly variable influence on the deformation of the optical element, in turn, is possible in this way.

Likewise, the actuator device can be configured to set, for two of the peripheral regions, tangential interface forces that are at an angle with respect to one another. Finally, the actuator device can be configured to set tangential interface forces that are at least substantially parallel to one another, in particular, at least substantially opposite to one another, for two of the peripheral regions. In particular, this can be realized particularly easily if the two peripheral regions are substantially diametrically opposite to one another in the radial direction.

In further variants, in which the holding element again defines a circumferential direction, a radial direction, and an axial direction, which runs perpendicular to a plane defined by the circumferential direction and the radial direction, the actuator device is configured to set, under control of the control device and in at least one peripheral region of the holding element, a definable axial interface force that acts parallel to the axial direction on the optical element. Such axial forces can likewise be used to generate desired deformations of the optical element in a particularly simple manner. In this case, the actuator device may once again comprise one or more actuator units, by which the interface force can be set. The actuator device can comprise an actuator unit which is assigned to the at least one peripheral region and is configured to set the axial interface force.

In certain variants, the holding element again has a plurality of separate peripheral regions, with the actuator device being configured to set, under control of the control device, a definable axial interface force in each of the peripheral regions. In this case, the actuator device can be configured to set the axial interface forces separately for two of the peripheral regions. A particularly variable influence on the deformation of the optical element is possible in this way.

Here, too, it is possible for the actuator device to be configured to set, for two of the peripheral regions, axial interface forces that are at least substantially opposite to one another. In particular, this can be realized particularly easily if the two peripheral regions are substantially diametrically opposite to one another in the radial direction. Likewise, such opposing axial interface forces can be set particularly easily on two directly adjacent peripheral regions with which the actuator device engages.

In further variants, in which the holding element again defines a circumferential direction, a radial direction, and an axial direction, which runs perpendicular to a plane defined by the circumferential direction and the radial direction, the actuator device is configured to set, under control of the control device and in at least one peripheral region of the holding element, at least one definable interface moment that acts on the optical element. Such interface moments can likewise be used to generate desired deformations of the optical element in a particularly simple manner. In this case, the actuator device may once again comprise one or more actuator units, by which the interface moment can be set. The actuator device can comprise an actuator unit which is assigned to the at least one peripheral region and is configured to set the at least one interface moment.

In general, the interface moment in question can have any suitable direction, which naturally is adapted to the deformation of the optical element to be achieved. Particularly good results can be realized in a relatively simple manner if the at least one interface moment acts in the circumferential direction and/or if the at least one interface moment acts in the axial direction and/or if the at least one interface moment acts in the radial direction.

In certain variants, the holding element again has a plurality of separate peripheral regions, with the actuator device being configured to set, under control of the control device, at least one definable interface moment in each of the peripheral regions. In this case, the actuator device can be configured to set the interface moments separately for two of the peripheral regions. A particularly variable influence on the deformation of the optical element is possible in this way.

Here, too, it is possible for the actuator device to be configured to set, for two of the peripheral regions, interface moments that are at an angle with respect to one another. Likewise, the actuator device can be configured to set, for two of the peripheral regions, interface moments that are at least substantially opposite to one another. Particularly simple variants can be realized here, in the case of which the actuator device engages with two peripheral regions (for example, two diametrically opposite or two immediately adjacent peripheral regions) and the interface moments on the two peripheral regions are set by way of the pair of moment and reaction moment at the two points of engagement.

It is understood that provision can be made for the aforementioned forces or moments to be set in each case on an individual basis at the interfaces. Likewise, it is naturally possible for the aforementioned forces (radial, tangential, axial) or moments on the interfaces to be superposed on one another in any combination (typically in any linear combination). This superposition can be implemented for one or more (possibly all) peripheral regions of the respective holding element. Likewise, different forces (radial, tangential, axial) or moments can be set and/or superposed in any combination or in any distribution or in any alternation on the individual peripheral regions within the respective holding element. For example, any desired or periodic alternation in the set and/or superposed forces and/or moments can be provided from peripheral region to peripheral region in the circumferential direction. Furthermore, opposing directions of the set and/or superposed forces and/or moments can be provided on adjacent peripheral regions, for example in order to obtain a wave-shaped deformation on the periphery of the holding element. With all of these variants, particularly precise settings of the deformation of the optical element and its optical surface can be realized.

As already mentioned, the actuator device can be designed in any suitable way which is in accordance with the deformation of the optical element to be achieved. In some variants which are relatively easy to realize, the holding element has a plurality of separate peripheral regions, with the actuator device comprising at least one assigned actuator unit for each of the peripheral regions. In this case, the number N of separate peripheral regions can be 3 to 60, such as 6 to 30, for example 12 to 24. However, it is understood that, in general, any number of separate peripheral regions can be provided. By way of example, the number of separate peripheral regions may depend on the size of the outer periphery of the holding element and/or the installation space available for the integration or connection of the actuator units (with an increasing outer periphery then being able to be accompanied by a greater number of separate peripheral regions). Furthermore, two of the peripheral regions to which an actuator unit is assigned can be adjacent to one another, as has already been explained above in the context of certain variants by way of example. Likewise, the peripheral regions can define a center of the holding element and two of the peripheral regions to which an actuator unit is assigned can then be arranged diametrically opposite one another with respect to the center. This, too, has already been explained above in exemplary fashion in the context of specific variants.

Further variants are distinguished by the fact that the holding element has a plurality of separate peripheral regions and the actuator device comprises a plurality of actuator units which act on at least one of the peripheral regions. In this way, in particular, the above-described superposition of forces and/or moments at the interface to the optical element can be achieved in a simple manner. In general, any number of actuator units can be chosen in this case and adapted to the superposition of forces and/or moments to be achieved or the deformation of the optical element to be achieved thereby.

In certain variants, at least two actuator units can be assigned to at least one peripheral region, such as to a plurality of peripheral regions in each case, for example to all of the peripheral regions in each case. The arrangement of the actuator units can be effected in any desired suitable manner, in general. In particular, at least two actuator units can act kinematically in series with one another on the same peripheral region. Additionally or alternatively, at least two actuator units can act kinematically in parallel with one another on the same peripheral region.

Likewise, provision can be made for at least two actuator units to act on the same peripheral region, wherein the at least two actuator units, under control of the control device, set definable interface forces that act in different directions on the optical element and/or set a definable interface force that acts on the optical element and a definable interface moment that acts on the optical element and/or set definable interface moments that act in different directions on the optical element. In this way, the superpositions of interface forces and/or interface moments already described above in exemplary fashion can be achieved.

The respective actuator device may in general be designed in any way. By way of example, the respective actuator unit of the actuator device can act directly on the holding element and/or the optical element. However, in certain variants, provision can also be made for the actuator device to comprise at least one actuator unit and for the actuator unit to act on the holding element by way of at least one intermediate element. In this case, the intermediate element can be connected to the first interface section in the region of a first end and to the actuator unit in the region of a second end. Hence, the intermediate element can be a movement reduction element, by which a reduction between a displacement at the actuator unit and the resulting displacement at the first interface section is achieved. The intermediate element can be a lever element, for example. In this way, in particular, the above-described movement reduction can be realized in a particularly simple manner. Likewise, the intermediate element can be a spring element. In this way, in particular, the above-described movement reduction can also be realized in a particularly simple manner.

As already mentioned, the actuator device can act between the holding element and the optical element, and hence the actuator device can form the first interface to the optical element. In certain variants that are particularly easy to realize, provision is made for the actuator device to comprise at least one actuator unit and for the at least one actuator unit to act on the holding element between the first interface and the second interface. With such an actuator unit acting purely internal to the holding element, it is possible, in particular, to realize a design in which the holding element is optimized for the connection to the optical element or to the support unit, and hence an introduction of the supporting forces is realized. The actuator unit can then be arranged substantially external to the (actual) supporting-force flow and can be designed or optimized merely for the deformation function. Optionally, the at least one actuator unit is connected to the first interface section at one end and/or connected to the second interface section at one end. This makes it possible to obtain particularly simple and compact configurations.

In general, the actuator device can be designed in any desired way with one or more passive and/or active components. In certain variants, the actuator device comprises at least one actuator unit with at least one active element. Any type of actuator can be used here. Thus, the at least one active element can be designed in the manner of a force actuator. Likewise, the at least one active element can be designed in the manner of a displacement actuator. In general, there is also full design freedom with regard to the type of actuator movement generated. Thus, the at least one active element can be designed in the manner of a linear actuator. Likewise, the at least one active element can be designed in the manner of a shear actuator. The same applies with regard to the power supply or the operating principle of the active element. Thus, the at least one active element can be an element, in particular a piezo element, supplied with electrical energy. Likewise, the at least one active element can be an element supplied with thermal energy. Likewise, the at least one active element can be an element supplied with magnetic energy. Naturally, any combination of the aforementioned variants can also be provided for the active element.

In general, the connection of the holding element to the optical element can be designed in any suitable manner in order to achieve an introduction of the supporting forces into the optical element. In variants, the holding element is configured to be at least partially inserted into a cutout in the optical element. In this case, in particular, the first interface can be connected to a wall of the cutout. This allows particularly compact configurations to be achieved.

The holding element, at least section-wise, in particular, in the region of the first interface section, can be designed in the manner of a bushing. In this case, a plurality of peripheral regions separated from one another by slots can be formed in order to obtain a particularly simple subdivision into separate peripheral regions. In this case, at least one of the peripheral regions can be designed to be resilient in a radial direction of the bushing in order to obtain a simple introduction of the forces and/or moments of the actuator device into the optical element.

In certain variants, the holding element is designed, at least section-wise, in the manner of a bushing which defines a central region of the holding element, with the second interface section being arranged in the central region of the holding element. In this way, particularly compact configurations with a desired force flow can be achieved.

In general, the holding element can be connected by way of a force-fitting, form-fitting or material connection, either alone or in any combination. Particularly simple and compact designs arise if the holding element is connected, at least section-wise, to the optical element via a material connection, in particular an adhesive bond.

The present disclosure also relates to an optical imaging device, in particular a microlithographic optical imaging device, comprising an illumination device having a first optical element group, an object device for receiving an object, a projection device having a second optical element group and an image device. The illumination device is configured to illuminate the object while the projection device is configured to project an image of the object onto the image device. In this case, the illumination device and/or the projection device comprises at least one optical arrangement according to the disclosure, as has been described above. This makes it possible to realize to the same extent the variants and features described above, and so reference is made in this respect to the explanations given above in order to avoid repetition.

In some variants of the optical imaging device, a detection device connected to the control device is provided for detecting a current imaging error of the imaging device. In this case, the control device is configured to control the actuator device to correct the imaging error on the basis of the current imaging error. Here, it is understood that the actuator device does not necessarily have to be controlled for the complete correction of the imaging error or does not have to be suitable at all for the complete correction of the imaging error. Rather, further components of the imaging device can be used for the correction. The actuator device merely has to be suitable or be able to be controlled in order to make a significant contribution to the correction of the imaging error.

To correct the imaging error, the control device can, in particular, use stored influence information which is representative of an influence of an actuation of the actuator device on the imaging error of the imaging device. By way of example, to this end, a field-dependent profile of the imaging error (what is known as an aberration fingerprint) can be detected during the operation of the imaging device and can be compared to imaging errors which were detected previously and stored accordingly in the control device (what are known as aberration patterns) and which arise due to deformations of the surface of the optical element as may be caused by a defined introduction of force and/or introduction of moment by the optical arrangement according to the disclosure. Instead of directly detecting the imaging error, the control device can likewise use a stored (empirically and/or theoretically determined) model of the imaging device, which model represents the imaging error of the optical imaging as a function of specific operating parameters of the imaging device. Currently recorded values of these operating parameters can then be used to deduce or predict the current imaging error (via the model). The control device can then accordingly control the actuator device (as described above) for the purposes of the correction.

In general, the optical arrangement can be arranged at any suitable point in the optical imaging device. Thus, the imaging device can have a first component and a second component in an imaging beam path from the illumination device to the image device, with the first component defining an image field of the image representation on the image device and the second component defining a pupil of the imaging device. The optical arrangement according to the disclosure can then be arranged in the imaging beam path closely adjacent to the first component. In this case, the obtained deformation of the optical element has a distinctly location-dependent influence on the imaging error or its correction. Likewise, the optical arrangement can be arranged in the imaging beam path closely adjacent to the second component. In this case, the obtained deformation of the optical element has a comparatively uniform or location-independent influence on the imaging error or its correction. Likewise, the optical arrangement can be arranged in the imaging beam path in the region of an intermediate position remote from the first component and the second component in order to achieve a correspondingly moderately location-dependent influence of the obtained deformation of the optical element on the imaging error or its correction.

The present disclosure furthermore relates to a method for supporting a microlithographic optical element, in particular, for using light in the extreme UV (EUV) range, wherein the optical element is held by a holding device with at least one holding element which has a first interface section and a second interface section. In this case, the first interface section forms a first interface via which the at least one holding element, in an assembled state, is connected to the optical element. The second interface section forms a second interface via which the holding element, in the assembled state, is connected to a support unit, in particular an active support unit, which connects the optical element to a support structure for the purpose of supporting the optical element on the support structure by way of a supporting force. An actuator device of the holding device engages with the holding element between the first interface and the second interface, wherein the actuator device acts in a controlled manner on the holding element such that, at the first interface, a definable interface deformation and/or a definable interface force distribution that acts on the optical element is set. This makes it possible to realize to the same extent the variants and features described above in relation to the optical arrangement, and so reference is made in this respect to the explanations given above in order to avoid repetition.

The present disclosure also relates to an optical imaging method, in particular, for microlithography, wherein an illumination device which has a first optical element group illuminates an object and a projection device which has a second optical element group projects an image of the object onto an image device. At least one optical element of the illumination device and/or the projection device is supported via a method according to the disclosure. This likewise makes it possible to realize to the same extent the variants and features described above in relation to the optical arrangement, and so reference is made in this respect to the explanations given above in order to avoid repetition.

In this case, in particular, a current imaging error of the imaging can be detected and the actuator device can be controlled to correct the imaging error on the basis of the current imaging error, wherein, in particular, stored influence information is used which is representative of an influence of an actuation of the actuator device on the imaging error.

Further aspects and exemplary embodiments of the disclosure are evident from the dependent claims and the following description of certain exemplary embodiments, which refers to the accompanying figures. All combinations of the disclosed features, irrespective of whether or not they are the subject of a claim, lie within the scope of protection of the disclosure.

DETAILED DESCRIPTION OF THE DISCLOSURE

First Exemplary Embodiment

An exemplary embodiment of a microlithographic projection exposure apparatus 101 according to the disclosure, which comprises an exemplary embodiment of an optical arrangement according to the disclosure, is described below with reference to FIGS. 1 to 3. To simplify the following explanations, an x, y, z coordinate system is indicated in the drawings, the z direction running parallel to the direction of gravitational force. Accordingly, the x-direction and the y-direction run horizontally, with the x-direction running perpendicularly into the plane of the drawing in the illustration in FIG. 1. It goes without saying that it is possible in further configurations to choose any desired other orientations of an x, y, z coordinate system.

Certain parts of a projection exposure apparatus 101 are described in exemplary fashion below initially with reference to FIG. 1. The description of the basic structure of the projection exposure apparatus 101 and its components should not be construed as limiting here.

An illumination device or an illumination system 102 of the projection exposure apparatus 101 comprises, in addition to a radiation source 102.1, an optical element group in the form of an illumination optical unit 102.2 for illuminating an object field 103.1 (shown schematically). The object field 103.1 lies in an object plane 103.2 of an object device 103. A reticle 103.3 (also referred to as a mask) arranged in the object field 103.1 is illuminated in this case. The reticle 103.3 is held by a reticle holder 103.4. The reticle holder 103.4 is displaceable by way of a reticle displacement drive 103.5, in particular in one or more scanning directions. In the present example, such a scanning direction runs parallel to the y-axis.

It goes without saying that in other variants provision can also be made for the radiation source 102.1 to be designed as a separate module from the illumination system 102. In this case, the illumination system 102 consequently does not comprise the radiation source 102.1.

The projection exposure apparatus 101 furthermore comprises a projection device 104 with a further optical element group in the form of a projection optical unit 104.1. The projection optical unit 104.1 serves for imaging the object field 103.1 into an image field 105.1 (as depicted schematically), which is located in an image plane 105.2 of an image device 105. The image plane 105.2 extends parallel to the object plane 103.2. Alternatively, an angle that differs from 0° is also possible between the object plane 103.2 and the image plane 105.2.

During exposure, a structure of the reticle 103.3 is imaged onto a light-sensitive layer of a substrate in the form of a wafer 105.3, the light-sensitive layer being arranged in the image plane 105.2 in the region of the image field 105.1. The wafer 105.3 is held by a substrate holder or wafer holder 105.4. The wafer holder 105.4 is displaceable by way of a wafer displacement drive 105.5, in particular in the y-direction. The displacement, firstly, of the reticle 103.3 by way of the reticle displacement drive 103.5 and, secondly, of the wafer 105.3 by way of the wafer displacement drive 105.5 can be implemented so as to be synchronized with one another. This synchronization can be implemented, for example, by way of a common control device 106 (shown only very schematically and without control paths in FIG. 1).

The radiation source 102.1 is an EUV radiation (extreme ultraviolet radiation) source. The radiation source 102.1 emits EUV radiation 107 in particular, which is also referred to below as used radiation or illumination radiation. In particular, the used radiation has a wavelength in the range between 5 nm and 30 nm, in particular a wavelength of approximately 13 nm. The radiation source 102.1 can be a plasma source, for example an LPP (laser produced plasma) source or a GDPP (gas discharge produced plasma) source. It may also be a synchrotron-based radiation source. However, the radiation source 102.1 can also be a free electron laser (FEL).

Since the projection exposure apparatus 101 operates with used light in the EUV range, the optical elements used are exclusively reflective optical elements. In further configurations of the disclosure, it is of course also possible (in particular depending on the wavelength of the illumination light) to use any type of optical elements (refractive, reflective, diffractive) alone or in any desired combination for the optical elements.

The illumination radiation 107 emerging from the radiation source 102.1 is focused by a collector 102.3. The collector 102.3 may be a collector with one or more ellipsoidal and/or hyperboloidal reflection surfaces. The illumination radiation 107 can be incident on the at least one reflection surface of the collector 102.3 with grazing incidence (GI), that is to say at angles of incidence of greater than 45°, or with normal incidence (NI), that is to say at angles of incidence of less than 45°. The collector 11 may be structured and/or coated on the one hand for optimizing its reflectivity for the used radiation and on the other hand for suppressing extraneous light.

Downstream of the collector 102.3, the illumination radiation 107 propagates through an intermediate focus in an intermediate focal plane 107.1. In certain variants, the intermediate focal plane 107.1 can represent a separation between the illumination optical unit 102.2 and a radiation source module 102.4, which comprises the radiation source 102.1 and the collector 102.3.

Along the beam path, the illumination optical unit 102.2 includes a deflection mirror 102.5 and a downstream first facet mirror 102.6. The deflection mirror 102.5 may be a plane deflection mirror or, alternatively, a mirror with a beam-influencing effect that goes beyond the purely deflecting effect. Alternatively or additionally, the deflection mirror 102.5 can be designed as a spectral filter which at least partially separates what is known as extraneous light from the illumination radiation 107, the wavelength of which extraneous light differs from the used light wavelength. If the optically effective surfaces of the first facet mirror 102.6 are arranged in the region of a plane of the illumination optical unit 102.2 which is optically conjugate to the object plane 103.2 as a field plane, the first facet mirror 102.6 is also referred to as a field facet mirror. The first facet mirror 102.6 comprises a multiplicity of individual first facets 102.7, which are also referred to as field facets below. These first facets and their optical surfaces are indicated only very schematically in FIG. 1 by the dashed contour 102.7.

The first facets 102.7 may be embodied as macroscopic facets, in particular as rectangular facets or as facets with an arcuate edge contour or an edge contour of part of a circle. The first facets 102.7 may be embodied as facets with a planar optical surface or alternatively with a convexly or concavely curved optical surface.

As known for example from DE 10 2008 009 600 A1 (the entire disclosure of which is incorporated herein by reference), the first facets 102.7 themselves can also be composed in each case of a multiplicity of individual mirrors, in particular a multiplicity of micromirrors. The first facet mirror 102.6 can in particular be designed as a microelectromechanical system (MEMS system), as is described in detail in DE 10 2008 009 600 A1, for example.

In the present example, the illumination radiation 107 travels horizontally, that is to say in the y-direction, between the collector 102.3 and the deflection mirror 102.5. It goes is without saying, however, that in the case of other variants different alignments may also be chosen.

In the beam path of the illumination optical unit 102.2, a second facet mirror 102.8 is arranged downstream of the first facet mirror 102.6. If the optically effective surfaces of the second facet mirror 102.8 are arranged in the region of a pupil plane of the illumination optical unit 102.2, the second facet mirror 102.8 is also referred to as a pupil facet mirror. The second facet mirror 102.8 may also be arranged at a distance from a pupil plane of the illumination optical unit 102.2. In this case, the combination of the first facet mirror 102.6 and the second facet mirror 102.8 is also referred to as a specular reflector. Such specular reflectors are known, for example, from US 2006/0132747 A1, EP 1 614 008 B1 or U.S. Pat. No. 6,573,978 (the entire disclosure of each of which is incorporated herein by reference).

Figure 1:
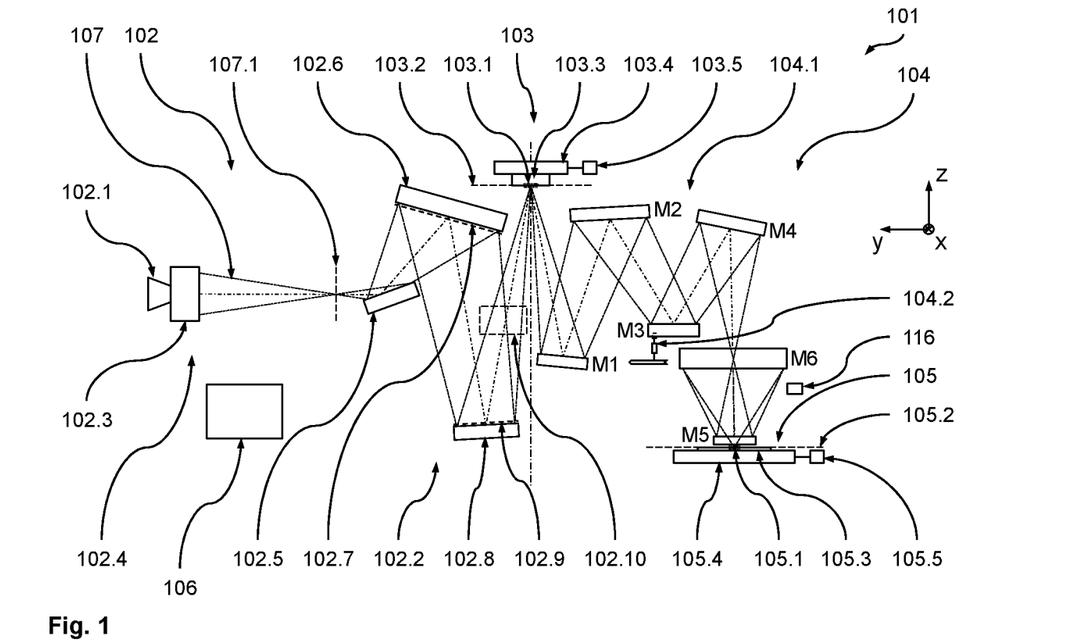
FIG. 1 is a schematic illustration of an embodiment of a projection exposure apparatus according to the disclosure, which comprises an embodiment of an optical arrangement according to the disclosure.

The second facet mirror 102.8 in turn comprises a plurality of second facets, which are indicated only very schematically in FIG. 1 by the dashed contour 102.9. In the case of a pupil facet mirror, the second facets 102.9 are also referred to as pupil facets. In general, the second facets 102.9 can have the same design as the first facets 102.7. In particular, the second facets 102.9 can likewise be macroscopic facets, which can have a round, rectangular or hexagonal edge, for example. Alternatively, the second facets 102.9 can be facets composed of micromirrors. The second facets 102.9 in turn may have planar reflection surfaces or alternatively reflection surfaces with convex or concave curvature. In this regard, reference is made anew to DE 10 2008 009 600 A1.

In the present example, the illumination optical unit 102.2 consequently forms a doubly faceted system. This basic principle is also referred to as fly's eye integrator. In certain variants, it may furthermore be desirable to arrange the optical surfaces of the second facet mirror 102.8 not exactly in a plane which is optically conjugate to a pupil plane of the projection optical unit 104.1.

In a further embodiment, not shown, of the illumination optical unit 102.2, a transfer optical unit 102.10 (depicted only very schematically) contributing in particular to the imaging of the first facets 102.7 into the object field 103.1 may be arranged in the beam path between the second facet mirror 102.8 and the object field 103.1. The transfer optical unit 102.10 may have exactly one mirror, or alternatively have two or more mirrors, which are arranged one behind the other in the beam path of the illumination optical unit 102.2. The transfer optical unit 102.10 may in particular comprise one or two normal-incidence mirrors (NI mirrors) and/or one or two grazing-incidence mirrors (GI mirrors).

In the embodiment as shown in FIG. 1, the illumination optical unit 102.2 has exactly three mirrors downstream of the collector 102.3, specifically the deflection mirror 102.5, the first facet mirror 102.6 (e.g., a field facet mirror), and the second facet mirror 102.8 (e.g., a pupil facet mirror). In a further embodiment of the illumination optical unit 102.2, there is also no need for the deflection mirror 102.5, and so the illumination optical unit 102.2 may then have exactly two mirrors downstream of the collector 102.3, specifically the first facet mirror 102.6 and the second facet mirror 102.8.

With the aid of the second facet mirror 102.8, the individual first facets 102.7 are imaged into the object field 103.1. The second facet mirror 102.8 is the last beam-shaping mirror or actually the last mirror for the illumination radiation 107 in the beam path upstream of the object field 103.1. The imaging of the first facets 102.7 into the object plane 103.2 via the second facets 102.9 or using the second facets 102.9 and a transfer optical unit 102.10 is often only approximate imaging.

The projection optical unit 104.1 comprises a plurality of mirrors Mi, which are numbered in accordance with their arrangement along the beam path of the projection exposure apparatus 101. In the example illustrated in FIG. 1, the projection optical unit 104.1 comprises six mirrors M1 to M6. Alternatives with four, eight, ten, twelve or any other number of mirrors Mi are likewise possible. The penultimate mirror M5 and the last mirror M6 may each have a passage opening (not depicted in any more detail) for the illumination radiation 107. In the present example, the projection optical unit 104.1 is a doubly obscured optical unit. The projection optical unit 104.1 has an image-side numerical aperture NA which is greater than 0.5. In particular, the image-side numerical aperture NA may also be greater than 0.6. By way of example, the image-side numerical aperture NA may be 0.7 or 0.75.

The reflection surfaces of the mirrors Mi may be in the form of freeform surfaces without an axis of rotational symmetry. Alternatively, the reflection surfaces of the mirrors Mi may be designed as aspheric surfaces with exactly one axis of rotational symmetry of the reflection surface shape. Just like the mirrors of the illumination optical unit 102.2, the mirrors Mi may have highly reflective coatings for the illumination radiation 107. These coatings can be constructed from a plurality of coatings (multilayer coatings); in particular, they may be designed with alternating layers of molybdenum and silicon.

In the present example, the projection optical unit 104.1 has a large object-image offset in the y-direction between a y-coordinate of a center of the object field 103.1 and a y-coordinate of the center of the image field 105.1. This object-image offset in the y-direction can be of approximately the same magnitude as a distance between the object plane 103.2 and the image plane 105.2 in the z-direction.

The projection optical unit 104.1 may, in particular, have an anamorphic form. In particular, it has different imaging scales $\beta x$, $\beta y$ in the x- and y-directions. The two imaging scales $\beta x$, $\beta y$ of the projection optical unit 104.1 can be ($\beta x$, $\beta y$)=(+/−0.25, +/−0.125). A positive imaging scale $\beta$ means imaging without image inversion. A negative sign for the imaging scale $\beta$ means imaging with image inversion. In the present example, the projection optical unit 104.1 consequently leads to a reduction in size with a ratio of 4:1 in the x-direction, that is to say in a direction perpendicular to the scanning direction. By contrast, the projection optical unit 104.1 leads to a reduction in size with a ratio of 8:1 in the y-direction, that is to say in the scanning direction. Other imaging scales are likewise possible. Imaging scales with the same sign and the same absolute value in the x-direction and y-direction are also possible, for example with absolute values of 0.125 or of 0.25.

The number of intermediate image planes in the x-direction and in the y-direction in the beam path between the object field 103.1 and the image field 105.1 can be the same. Likewise, the number of intermediate image planes may also differ, depending on the design of the projection optical unit 104.1. Examples of projection optical units with differing numbers of such intermediate images in the x- and y-directions are known, for example, from US 2018/0074303 A1 (the entire disclosure of which is incorporated herein by reference).

In each case one of the pupil facets 102.9 in the present example is assigned to exactly one of the field facets 102.7 for forming in each case an illumination channel for illuminating the object field 103.1. This may in particular produce illumination according to the Köhler principle. The far field is decomposed into a multiplicity of object fields 103.1 with the aid of the field facets 102.7. The field facets 102.7 generate a plurality of images of the intermediate focus on the pupil facets 102.9 respectively assigned thereto.

The field facets 102.7 are each imaged onto the reticle 103.3 by an assigned pupil facet 102.9, with the image representations being overlaid such that there is thus an overlaid illumination of the object field 103.1. The illumination of the object field 103.1 can be as homogeneous as possible. It can have a uniformity error of less than 2%. The field uniformity can be achieved by way of the overlay of different illumination channels.

The illumination of the entrance pupil of the projection optical unit 104.1 can be defined geometrically by way of an arrangement of the pupil facets 102.9. The intensity distribution in the entrance pupil of the projection optical unit 104.1 can be set by selecting the illumination channels, in particular the subset of the pupil facets 102.9 which guide light. This intensity distribution is also referred to as illumination setting of the illumination system 102. A likewise pupil uniformity in the region of sections of an illumination pupil of the illumination optical unit 102.2 which are illuminated in a defined manner may be achieved by a redistribution of the illumination channels. In the case of actively adjustable facets, the aforementioned settings can be made in each case by corresponding control by way of the control device 106.

Further aspects and details of the illumination of the object field 103.1 and, in particular, of the entrance pupil of the projection optical unit 104.1 are described below.

The projection optical unit 104.1 may have in particular a homocentric entrance pupil. The latter can be accessible or else inaccessible. The entrance pupil of the projection optical unit 104.1 frequently cannot be exactly illuminated using the pupil facet mirror 102.8. In the case of imaging of the projection optical unit 104.1 which telecentrically images the center of the pupil facet mirror 102.8 onto the wafer 105.3, the aperture rays often do not intersect at a single point. However, it is possible to find an area in which the distance of the aperture rays determined in pairs becomes minimal. This area represents the entrance pupil or an area in real space that is conjugate thereto. In particular, this area has a finite curvature.

It may be the case for certain variants that the projection optical unit 104.1 has different poses of the entrance pupil for the tangential beam path and for the sagittal beam path. In this case, it is optional for an imaging optical element, in particular an optical component part of the transfer optical unit 102.10, to be provided between the second facet mirror 102.8 and the reticle 103.3. With the aid of this imaging optical element, the different poses of the tangential entrance pupil and the sagittal entrance pupil can be taken into account.

With the arrangement of the components of the illumination optical unit 102.2, as shown in FIG. 1, the optical surfaces of the pupil facet mirror 102.8 are arranged in a surface that is conjugate to the entrance pupil of the projection optical unit 104.1. The first facet mirror 102.6 (field facet mirror) defines a first main plane of extent of its optical surfaces, which is arranged tilted to the object plane 5 in the present example. In the present example, this first main plane of extent of the first facet mirror 102.6 is arranged tilted to a second main plane of extent, which is defined by the optical surface of the deflection mirror 102.5. In the present example, the first main plane of extent of the first facet mirror 102.6 is also arranged tilted to a third main plane of extent, which is defined by the optical surfaces of the second facet mirror 102.8.

The optical element groups 102.2, 104.1 may comprise one or more optical arrangements 108 according to the disclosure, as is described below with reference to the mirror M3 which forms an optical element of the optical element group 104.1.

The optical arrangement 108 comprises a holding device 109 for holding the optical element M3. For this purpose, in the present example, the holding device 109 has a plurality of holding elements 110 which are connected to the optical element M3 in order to hold it. It goes without saying here that (in particular depending on the size and/or mass of the optical element) a single holding element 110 may optionally also be sufficient to hold the optical element. Likewise, in certain variants, it may be sufficient to design only one holding element 110 or only some of the holding elements for the optical element as an active holding element in the manner described herein.

The holding element 110 has a first interface section 110.1 and a second interface section 110.2. The first interface section 110.1 forms a first interface IF1 via which the holding element 110, in an assembled state, is connected to the optical element M3. In the present example, the first interface section 110.1 runs along the outer circumference of the holding element 110 such that a substantially completely circumferential first interface IF1 is formed, as will be explained in more detail below. The second interface section 110.2 forms a second interface IF2 via which the holding element 110, in the assembled state, is connected to a support unit 104.2 (an active support unit in the present example).

The support unit 104.2 connects the optical element M3 to a support structure of the projection device 104 in order to support the optical element M3 on the support structure by way of a supporting force, as is shown only in highly schematic form in FIG. 1 for the optical element M3. Consequently, the holding element 110 is therefore arranged kinematically in series along the supporting-force flow between the optical element M3 and the support unit 104.2, and so the optical element M3 is connected to the support unit 104.2 via the holding element 110. For example, the support unit 104.2 can be part of a conventional parallel kinematic system, for example of a well-known hexapod kinematic system. In particular, the support can be actively designed so that the rigid-body pose of the optical element M3 (i.e., its position and orientation in the six degrees of freedom in space) can be set in space in one or more of the degrees of freedom (up to all six degrees of freedom) by virtue of the support units 104.2 being controlled accordingly by the control device 106.

It goes without saying that any other type of support for an optical element of the projection exposure apparatus 101 can also be chosen in other variants. In particular, the arrangement 108 can also be used in combination with passive support units 104.2. This can mean that active influencing of the imaging error can be implemented even in the case of arrangements with optical elements that are subject to strict installation space restrictions.

The holding device 109 further comprises an actuator device 111, the actuator device 111 engaging with the holding element 110 between the first interface IF1 and the second interface IF2. The actuator device 111 is configured to act, under control of the control device 106, on the holding element 110 in such a way that a definable interface deformation (i.e., a deformation of the first interface IF1) and/or a definable interface force distribution that acts on the optical element M3 is set at the first interface IF1, as will be explained in more detail below.

A targeted deformation of the optical element M3 can be implemented in a simple manner with this design. In the case of this configuration, it can be desirable for the devices for generating the deformation of the optical element M3, that is to say the actuator device 111, are integrated into the holding element 110 which forms the interface between the optical element M3 and the assigned support unit 104.2. In particular, what this can achieve in a desirable fashion is that the forces and/or moments that are introduced into the optical element M3 via the actuator device 111 only have a small parasitic influence (if any) on the rigid-body pose of the optical element M3 in space (i.e., position and orientation in the six degrees of freedom in space). In addition, this integration of the actuator device 111 in the region of the holding elements 110 makes it possible to make the energy supply and control of the actuator device 111 correspondingly simple (for example, to integrate or arrange it in the region of the support unit 104.2) without increasing the risk of introducing parasitic stresses into the optical element M3 in this way.

The present design is based in particular on the insight that suitable introduction of deforming forces and/or moments into the optical element M3 in the region of the respective first interface IF1 between the support units 104.2 and the optical element M3 already allows the realization of a deformation of the optical element M3 and its optical surface 112.1 using comparatively small forces and/or moments which are generated via the actuator device 111. In particular, a so-called Z2_3 effect can optionally be achieved by a suitable superposition of forces and/or moments (in particular a linear combination of forces and/or moments) at the respective first interface IF1, which means that is possible to influence what is known as the Z2_3 field profile and hence the imaging errors of the imaging (which is described in a well-known manner by so-called Zernike functions).

It goes without saying here that, in general, the actuator device 111 can be a part of the holding element 110 itself or can be integrated into the holding element 110 (more precisely into the structure of the holding element 110), as will be explained in more detail below. In this case, the actuator device 110 can also be located directly in the supporting-force flow from the support unit 104.2 in question to the optical element M3. In particular, the actuator device 111 itself can also form the first and/or second interface in question, for example.

In the present example, the actuator device 111 engages with different parts of the holding element 110 in order to achieve the forces and/or moments in the region of the first interface IF1. In this case, the actuator device 111, in particular, acts kinematically in parallel with the (actual) supporting-force flow from the respective support unit 104.2 to the optical element M3. In this case, the actuator device 111 can be designed in any suitable way which is in accordance with the deformation of the optical element M3 to be achieved.

It goes without saying that, in general, the holding element 110 can be designed in any suitable manner in order to form the interfaces IF1 and IF2 between the respective support unit 104.2 and the optical element M3. Any desired geometries matched to the optical element M3 and/or the assigned support unit 104.2 can be used in this case for as long as there is a connection and/or integration of the actuator unit 111 with which the desired forces and/or moments can be introduced into the optical element M3.

In the present example, the holding element 110 is designed in the manner of a section-wise hollow-cylindrical, pot-shaped bushing that is inserted into a correspondingly complementarily designed cutout 112.2 in the mirror body 112.3 of the optical element M3. In this case, the first interface section 110.1 of the holding element 110 is connected to the wall 112.4 which delimits the cutout 112.2. In this case, the holding element 110 defines a circumferential direction CD, a radial direction RD, and an axial direction AD, the axial direction AD running perpendicular to a plane defined by the circumferential direction CD and the radial direction RD.

In the present example, the holding element 110, in the region of the first interface section 110.1, is divided into a multiplicity of mutually separate peripheral regions 110.4 by slots 110.3 (which are continuous in the radial direction RD). The slots 110.3 run in the axial direction AD up to a bottom section 110.5 of the holding element 110. As a result, leaf spring-like peripheral regions 110.4 are formed, which are comparatively compliant in the radial direction RD of the bushing 110. This separation or relatively extensive mechanical decoupling of the peripheral regions 110.4 in certain degrees of freedom (e.g., translationally in the radial direction RD and rotationally around the circumferential direction CD and around the axial direction AD) can easily cause forces and/or moments of the actuator device 111 to be introduced into the optical element M3, which forces and/or moments optionally vary significantly over the circumference between immediately adjacent peripheral regions 110.4.

The bottom section 110.5 of the holding element 110 defines a central region 110.6 (central in the radial direction RD) of the holding element 110, on which the second interface section 110.2 is arranged. In this way, a particularly compact configuration with a force flow is achieved.

Figure 2:
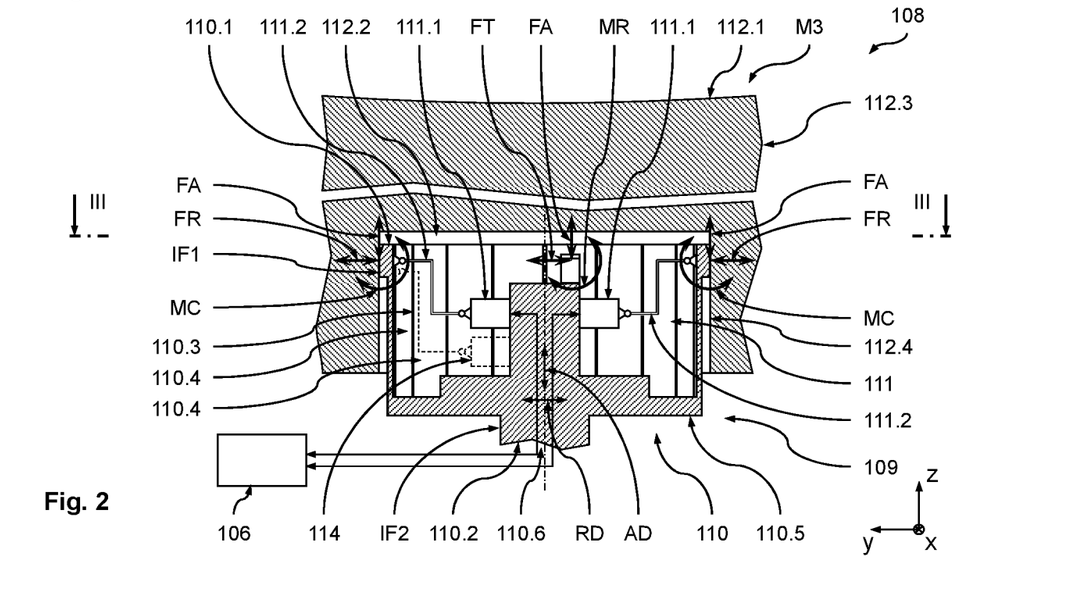
FIG. 2 is a schematic sectional view (along the line II-II in FIG. 3) of a part of the arrangement according to the disclosure from FIG. 1.
Figure 3:
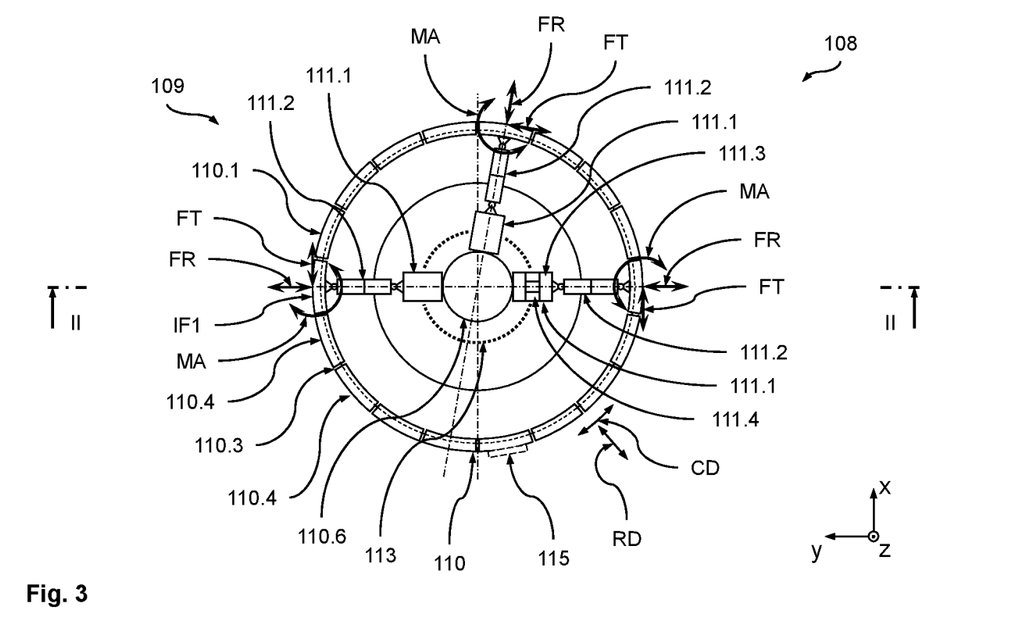
FIG. 3 is a schematic plan view (see line in FIG. 2) of the part of the arrangement according to the disclosure from FIG. 2.

In the present example, the actuator device 111 is configured to set, under control of the control device 106 and in one or more peripheral regions 110.4 of the holding element 110, a definable radial interface force FR which acts on the optical element M3 in the radial direction, as is shown by way of example in FIGS. 2 and 3 for two (FIG. 2) and three (FIG. 3) peripheral regions 110.4 respectively. Such radial forces FR can be used in a particularly simple manner to generate desired deformations of the optical element M3 and hence of its optical surface 112.1.

For this purpose, the actuator device 111 in the present example comprises a plurality of actuator units 111.1, which are supported on the central region 110.6 of the holding element 110 and are connected, in the first interface region 110.1, to the assigned peripheral region 110.4 via an intermediate element 111.2. The respective radial interface force FR can be set separately via the actuator units 111.1. Depending on the desired deformation properties of the optical surface 112.1 of the optical element M3, a separately controllable actuator unit 111.1 can be assigned in each case to any number of the peripheral regions 110.4, as indicated schematically by the dotted lines 113 in FIG. 3. In particular, each peripheral region 110.4 can be assigned an actuator unit 111.1. Naturally, this then allows a relatively precise setting of the interface force distribution over the circumference of the holding element 110 at the first interface IF1. In particular, there can be almost any variation of the interface forces FR. However, it is also understood that specific actuator units 111.1 can also be controlled jointly in order to obtain specific predetermined and defined interface force distributions.

Depending on the number and arrangement or distribution of the actuator units 111.1 over the peripheral regions 110.4, it is possible to obtain virtually any defined interface force distributions. Thus, it is possible, for example, to set or obtain radial interface forces FR which are at an angle with respect to one another for two of the peripheral regions 110.4. Likewise, at least substantially parallel radial interface forces FR can be set for two of the peripheral regions 110.4. This may be the case, for example, in two diametrically opposite peripheral regions 110.4, as shown in FIG. 3. In this case, the radial interface forces FR may also be set to be at least substantially opposite to one another. A periodic or any desired alternation or gradual transition of the radial interface forces FR from tensile forces to compressive forces at the first interface IF1 is likewise possible along the circumferential direction CD.

In further variants, the actuator device 111 can be additionally or alternatively configured to set, under the control of the control device 106 and in at least one peripheral region, optionally in a plurality of the peripheral regions 110.4, of the holding element 110, a definable tangential interface force FT that acts tangentially to the circumferential direction CD on the optical element. Such tangential forces FT can likewise be used in a particularly simple manner to generate desired deformations of the optical element M3 and, hence, of its optical surface 112.1. In this case, individual ones or a plurality of the actuator devices 111.1 described above can (additionally or alternatively) be configured to set such tangential forces FT. In respect of the variants of the distribution and arrangement of the actuator devices 111.1, reference is therefore made to the above explanations for setting the radial interface forces FR, which apply equally to the tangential interface forces FT.

The actuator device 111 can be configured to set, under control of the control device 106, a definable tangential interface force FT at the first interface IF1 in each of the peripheral regions 110.4. In particular, the actuator device 111 can be configured to set the tangential interface forces FT separately for a plurality (optionally all) of the peripheral regions 110.4. A particularly variable influence on the deformation of the optical element M3 or its optical surface 112.1, in turn, is possible in this way. In this case, the actuator device 111 can also set opposing tangential interface forces FT in the circumferential direction, in particular at two peripheral regions 110.4 (for example at peripheral regions 110.4 directly adjacent to one another). A particularly variable influence on the deformation of the optical element M3, in turn, is possible in this way.

In particular, the actuator device 111 can be configured to set tangential interface forces FT that are at an angle with respect to one another for two of the peripheral regions 110.4. Finally, the actuator device 111 can be configured to set, for two of the peripheral regions, tangential interface forces FT that are at least substantially parallel to one another, in particular at least substantially opposite to one another. In particular, this can be realized particularly easily if the two peripheral regions 110.4, in the radial direction RD, are substantially diametrically opposite to one another.

In further variants, the actuator device 111 can be additionally or alternatively configured to set, under the control of the control device 106 and in at least one peripheral region 110.4 of the holding element 110, a definable axial interface force FA that acts parallel to the axial direction AD on the optical element M3 at the first interface IF1. Such axial forces FA can likewise be used in a particularly simple manner to generate desired deformations of the optical element M3 and, hence, of its optical surface 112.1. In this case, individual or a plurality of the actuator devices 111.1 described above can (additionally or alternatively) be configured to set such axial forces FA. In respect of the variants of the distribution and arrangement of the actuator devices 111.1, reference is therefore made to the above explanations for setting the radial interface forces FR or the tangential interface forces FT, which apply equally to the axial interface forces FA.

The actuator device 111 can be configured to set, under the control of the control device 106, a definable axial interface force FA in each of the peripheral regions 110.4. In this case, the actuator device 111 can be configured to set the axial interface forces FA separately for a plurality (optionally all) of the peripheral regions 110.4. A particularly variable influence on the deformation of the optical element M3, in turn, is possible in this way.

Here, too, it is possible for the actuator device 111 to be configured to set, for two of the peripheral regions 110.4, axial interface forces FA that are at least substantially opposite to one another. By way of example, this may be provided for in peripheral regions 110.4 that are substantially diametrically opposite to one another in the radial direction RD. Likewise, such opposing axial interface forces FA can be set in two directly adjacent peripheral regions 110.4 with which the actuator device 111 engages.

In further variants, the actuator device 111 can be additionally or alternatively configured to set, under control of the control device 106 and in at least one peripheral region 110.4 of the holding element 110, at least one definable interface moment that acts on the optical element M3 at the first interface IF1. Such interface moments can likewise be used to generate desired deformations of the optical element M3 in a particularly simple manner. In this case, individual or a plurality of the actuator devices 111.1 described above can (additionally or alternatively) be configured to set such interface moments. In respect of the variants of the distribution and arrangement of the actuator devices 111.1, reference is therefore made to the above explanations for setting the interface forces FR or FT or FA, which apply equally to the interface moments.

In general, the interface moment in question can have any suitable direction, which naturally is adapted to the deformation of the optical element M3 to be achieved. Particularly desirable results can be obtained in a relatively simple manner if the at least one interface moment MC acts in the circumferential direction CD and/or if the at least one interface moment MA acts in the axial direction AD and/or if the at least one interface moment MR acts in the radial direction RD.

The actuator device 111 can be configured to set, under control of the control device 106 at least one definable interface moment MC and/or MA and/or MR in each of the peripheral regions 110.4. In this case, the actuator device 111 can be configured to set the interface moments separately for a plurality (optionally all) of the peripheral regions 110.4. Naturally, a particularly variable influence on the deformation of the optical element M3 is likewise possible in this way.

Here, too, it is possible for the actuator device 111 to be configured to set, for two of the peripheral regions, interface moments MC and/or MA and/or MR that are at an angle with respect to one another. Likewise, the actuator device 111 can be configured to set interface moments MC or MA or MR that are at least substantially opposite to one another for two of the peripheral regions 110.4.

It is understood that provision can be made for the aforementioned forces (FR, FT, FA) or moments (MC, MA, MR) to be set individually in each case on the peripheral regions 110.4 in the region of the first interface IF1. Likewise, it is naturally possible for the aforementioned forces (FR, FT, FA) or moments (MC, MA, MR) on the interfaces to be superposed on one another in any combination (typically in any linear combination). This superposition can be implemented for one or more (possibly all) peripheral regions 110.4 of the respective holding element 110. Likewise, different forces (FR, FT, FA) or moments (MC, MA, MR) can be set and/or superposed in any combination or in any distribution or in any alternation across the individual peripheral regions 110.4 within the respective holding element 110. For example, any desired or periodic alternation in the set and/or superposed forces (FR, FT, FA) and/or moments (MC, MA, MR) can be provided from peripheral region 110.4 to peripheral region 110.4 in the circumferential direction CD. Furthermore, opposing directions of the set and/or superposed forces (FR, FT, FA) and/or moments (MC, MA, MR) can be provided on adjacent peripheral regions 110.4, for example in order to obtain a wave-shaped deformation on the periphery of the holding element 110. With all of these variants, particularly precise settings of the deformation of the optical element M3 and its optical surface 112.1 can be realized.

As already mentioned, the actuator device 111 can be designed in any suitable way which is in accordance with the deformation of the optical element M3 to be achieved. In variants that are possible because they are easy to realize, the holding element, like in the present example, has a plurality of separate peripheral regions 110.4, with the actuator device 111 comprising at least one assigned actuator unit 111.1 for each of the peripheral regions. In this case, the number N of separate peripheral regions 110.4 can be 3 to 60, such as 6 to 30, for example 12 to 24. Furthermore, two of the peripheral regions 110.4 to which an actuator unit 111.1 is assigned can be adjacent to one another, as has already been explained above in the context of certain variants by way of example. Likewise, the peripheral regions 110.4 can define a center (the central region 104.6 in the present example) of the holding element 110, in which case two of the peripheral regions 110.4, to which an actuator unit 111.1 is assigned, can then be arranged diametrically opposite to one another with respect to the center 104.6. This, too, has already been explained above in exemplary fashion in the context of specific variants.

Further variants are distinguished by the fact that the actuator device 111 comprises a plurality of actuator units 111.1, which jointly act on at least one of the peripheral regions 110.4, as indicated schematically in FIG. 2 by the dashed contour 114. In this way, in particular, the above-described superposition of forces (FR, FT, FA) and/or moments (MC, MA, MR) at the first interface IF1 to the optical element M3 can be achieved n a simple manner. In general, any number of actuator units 111.1 can be chosen in this case and adapted to the superposition of forces (FR, FT, FA) and/or moments (MC, MA, MR) to be achieved or the deformation of the optical element M3 to be achieved thereby.

In certain variants, at least two actuator units 111.1, 114 can be assigned to at least one peripheral region 110.4, such as to a plurality of peripheral regions 110.4 in each case, for example to all of the peripheral regions 110.4 in each case. The arrangement of the actuator units 111.1, 114 can be effected in any desired suitable manner, in general. In particular, at least two actuator units 111.1 can act kinematically in series with one another on the same peripheral region 110.4. Additionally or alternatively, at least two actuator units 111.1, 114 can act kinematically in parallel with one another on the same peripheral region 110.4, as indicated in FIG. 2.

Likewise, provision can be made for at least two actuator units 111.1, 114 to act on the same peripheral region, wherein the at least two actuator units 111.1, 114, under control of the control device 106, set definable interface forces (FR, FT, FA) that act in different directions on the optical element M3 and/or set a definable interface force (FR, FT, FA) that acts on the optical element M3 and a definable interface moment (MC, MA, MR) that acts on the optical element M3 and/or set definable interface moments (MC, MA, MR) that act in different directions on the optical element. In this way, the superpositions of interface forces (FR, FT, FA) and/or interface moments (MC, MA, MR) already described above in exemplary fashion can be achieved.

Furthermore, it is understood that, in certain variants, the above-described superpositions of interface forces (FR, FT, FA) and/or interface moments (MC, MA, MR) can be achieved, for instance in the present example, by a corresponding design of the actuator units 111.1 themselves. Thus, the respective actuator unit 111.1 itself can be subdivided into different sections that provide different actuating movements or effective directions. For example, an actuator unit 111.1 can be constructed from a plurality of actuator elements 111.3, 111.4 arranged kinematically in series and/or kinematically in parallel, as indicated in FIG. 3. Likewise, the actuator elements 111.3, 111.4 can however also be designed as separate actuator units that act kinematically in series (see actuator elements 111.3 and 111.4) and/or kinematically in parallel (see actuator elements 111.4) with one another between the first interface IF1 and the second interface IF2.

The respective actuator device 111 may, in general, be designed in any way. By way of example, the respective actuator unit 111.1 of the actuator device 111 can act directly on the holding element 110 and/or the optical element M3. This is indicated in FIG. 3, for example, by the contour 115. In this case, the actuator unit 115 is arranged between the peripheral region 110.4 and the optical element M3 and thus itself forms a part of the first interface IF1. In this case, the actuator unit 115 is then also located directly in the force flow of the supporting force, by which the optical element M3 is supported on the support structure of the projection device 104.

In variants, however, at least one intermediate element 111.2 can also be provided, as in the present example, by which the actuator unit 111.1 acts on the holding element 110. In this case, the intermediate element, as in the present example, can be connected to the first interface section 110.1 in the region of a first end and to the actuator unit 111.1 in the region of a second end. The intermediate element 111.2 can form a movement reduction element, by which a reduction between a displacement at the actuator unit 111.1 and the resulting displacement at the first interface section 110.1 is achieved. To this end, the intermediate element 111.2 can be a lever element. In this way, in particular, the above-described movement reduction can be realized in a particularly simple manner. Likewise, as in the present example, the intermediate element 111.2 can be a spring element (here a leaf spring element). In this way, in particular, the above-described movement reduction can also be realized in a particularly simple manner by way of an elastic deformation of the spring element 111.2.

As already mentioned, the actuator device 111 can act between the holding element 110 and the optical element M3, and hence the actuator device 111 or its actuating unit(s) 115 can form the first interface IF1 to the optical element M3. In certain variants that are particularly easy to implement, provision is made, as in the present example, for the actuator unit 111.1 in question of the actuator device 111 to act on the holding element 110 between the first interface IF1 and the second interface IF2. With the actuator unit 111.1 thus acting purely internal to the holding element, it is possible, in particular, to realize a desirable design in which the holding element 110 is optimized for the connection to the optical element M3 or to the support unit 104.2, and hence an introduction of the supporting forces is realized. The actuator unit 111.1, as in the present example, can then be arranged substantially external to the (actual) supporting-force flow and can be designed or optimized merely for the deformation function.

In general, the actuator device 111 can be designed in any desired way with one or more passive and/or active components. In certain variants, the actuator device 111 comprises at least one actuator unit 111.1 with at least one active element in the form of an actuator 111.3. Any type of actuator can be used here. Thus, the at least one active element 111.3 can be designed in the manner of a force actuator. Likewise, the at least one active element 111.3 can be designed in the manner of a displacement actuator. In general, there is also full design freedom with regard to the type of actuator movement generated. Thus, the at least one active element 111.3 can be designed in the manner of a linear actuator. Likewise, the at least one active element 111.3 can be designed in the manner of a shear actuator. The same applies with regard to the power supply or the operating principle of the active element 111.3. Thus, the at least one active element 111.3 can be an element, in particular, a piezo element, supplied with electrical energy. Likewise, the at least one active element 111.3 can be an element supplied with thermal energy. Likewise, the at least one active element 111.3 can be an element supplied with magnetic energy. Naturally, any combination of the aforementioned variants can also be realized for the active element 111.3. Accordingly, as already mentioned, the actuator unit 111.1 can be constructed, for example, from a plurality of actuator elements 111.3 arranged kinematically in series and/or kinematically in parallel, as indicated in FIG. 3.

In general, the connection of the holding element 110 to the optical element M3 can be designed in any suitable manner in order to achieve an introduction of the supporting forces into the optical element M3. In the case of certain variants, as in the present example, the holding element 110 is at least partially inserted into a cutout 112.2 in the optical element M3 and connected to a wall 112.4 of the cutout 112.2. This allows particularly compact configurations to be achieved.

In general, the holding element 110 can be connected by way of a force-fitting, form-fitting or material connection, either alone or in any combination. Particularly simple and compact designs arise if the holding element 110, as in the present example, is connected, at least section-wise, to the optical element M3 via a material connection, in particular an adhesive bond.

In variants of the projection exposure apparatus 101, a detection device 116 (indicated only very schematically in FIG. 1) connected to the control device 106 is provided and is used to detect a current imaging error IE of the projection exposure apparatus 101. In this case, the control device 106 is configured to control the actuator device 111 to correct the imaging error IE on the basis of the current imaging error. Here, it is understood that the actuator device 111 does not necessarily have to be controlled for the complete correction of the imaging error IE or does not have to be suitable at all for the complete correction of the imaging error IE. Rather, further components of the projection exposure apparatus 101 can be used for the correction. The actuator device 111 merely has to be suitable or be able to be controlled in order to make a significant contribution to the correction of the imaging error IE.

To correct the imaging error IE, the control device 106 can in particular use stored influence information INFI which is representative of an influence of an actuation of the actuator device 111 on the imaging error IE of the projection exposure apparatus 101. By way of example, to this end, a field-dependent profile of the imaging error IE (what is known as an aberration fingerprint) can be detected during the operation of the projection exposure apparatus 101 and can be compared to imaging errors IES which were detected previously and stored accordingly in the control device 106 (what are known as aberration patterns) and which arise due to deformations of the optical surface 112.1 of the optical element M3 as may be caused by a defined introduction of force (FR, FT, FA) and/or introduction of moment (MC, MA, MR) by the optical arrangement 108.

Instead of directly detecting the imaging error IE, the control device 106 can likewise use a stored (empirically and/or theoretically determined) model MOD of the projection exposure apparatus 101, which model represents the imaging error IE of the optical imaging as a function of specific operating parameters PAR of the projection exposure apparatus 101 (IE=MOD(PAR)). Currently recorded values of these operating parameters PAR can then be used to deduce or predict the current imaging error IE (via the model MOD). The control device 106 can then accordingly control the actuator device 111 (as described above) for the correction of the imaging error IE.

In general, the optical arrangement 108 can be arranged at any suitable point in the optical imaging device. Thus, the imaging device can have a first component and a second component in an imaging beam path from the illumination device 102 to the image device 105, with the first component defining an image field of the image representation on the image device 105 and the second component defining a pupil of the imaging device. The optical arrangement 108 can then be arranged in the imaging beam path closely adjacent to the first component. In this case, the obtained deformation of the optical element of the optical arrangement 108 has a distinctly location-dependent influence on the imaging error IE or its correction. Likewise, the optical arrangement 108 can be arranged in the imaging beam path closely adjacent to the second component. In this case, the obtained deformation of the optical element of the optical arrangement 108 has a comparatively uniform or location-independent influence on the imaging error IE or its correction. Likewise, the optical arrangement 108 can be arranged in the imaging beam path in the region of an intermediate position remote from the first component and the second component in order to achieve a correspondingly moderately location-dependent influence of the obtained deformation of the optical element of the optical arrangement 108 on the imaging error or its correction.

It is to be noted that the optical arrangement 108 can be used in those optical elements where the deformation of their optical surface has a particularly large compensating effect on one or more components of the aberration IE. Naturally, it is optional here for the desired deformation of the optical surface to be able to be adjustable with the least possible effort and/or particularly precisely by way of the actuating movements of the associated actuator device(s).

Second Exemplary Embodiment

Figure 4:
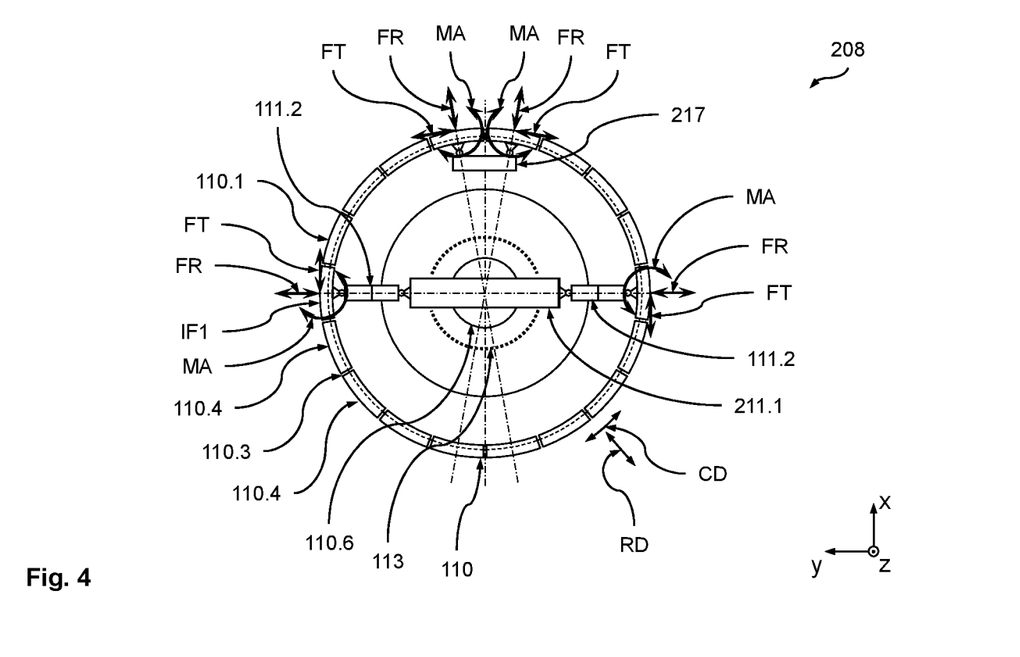
FIG. 4 is a schematic view of a part of a variant of the arrangement according to the disclosure (similar to the view of FIG. 3).

A further embodiment of the arrangement 208 according to the disclosure, which can be used in the imaging device 101 of FIG. 1 instead of the arrangement 108, is described below with reference to FIGS. 1 and 4. The arrangement 208 corresponds in its basic design and functionality to the arrangement 108 from FIGS. 2 and 3, and so only the differences are to be discussed here. In particular, identical components are provided with identical reference numerals, while similar components are provided with reference numerals increased by the value 100. Unless stated otherwise below, reference is made to the above statements in connection with the first exemplary embodiment with regard to the features, functions and features of these components.

One difference in relation to the first exemplary embodiment is that the actuator device 211 has an actuator unit 211.1, the ends of which engage with two diametrically opposite peripheral regions 110.4 by way of an intermediate element 111.2 in each case. The radial interface force FR and/or the tangential interface force FT and/or the axial interface force FA on these two peripheral regions 110.4 is then set by way of the pair of force and reaction force in question at the points of engagement on the peripheral regions 110.4. The same applies to the moments (MC, MA, MR) at the two peripheral regions 110.4. It is understood in this case that the actuator device 211 may also comprise a plurality of such actuator units 211.1, which each engage with two diametrically opposite peripheral regions 110.4.

A further difference in relation to the first exemplary embodiment is that the actuator device 211 has an actuator unit 217, the ends of which engage with two peripheral regions 110.4 directly adjacent to one another. The radial interface force FR and/or the tangential interface force FT and/or the axial interface force FA on these two peripheral regions 110.4 is then set by way of the pair of force and reaction force in question at the points of engagement on the peripheral regions 110.4. The same applies to the moments (MC, MA, MR) at the two peripheral regions 110.4.

It is understood in this case that the actuator device 211 may also comprise a plurality of such actuator units 217, which each engage with two directly adjacent peripheral regions 110.4. Likewise, an actuator unit 217 can also skip one or more peripheral regions 110.4 and, for example in the circumferential direction, only engage with the next but one peripheral region 110.4 (or a peripheral region 110.4 that is even further away).

It is understood that the above-described variants of the actuator device 111 or 211 or their actuator units 111.1, 115, 211.1 and 217 can be combined with one another as desired. It is also possible to design holding elements 110 of the optical element M3 or other optical elements of the projection exposure apparatus 101 differently, that is to say to design them with different actuator units 111.1, 115, 211.1, 217 or different combinations of actuator units 111.1, 115, 211.1, 217.

The present disclosure has been described above exclusively on the basis of examples from the field of microlithography. However, it is self-evident that the disclosure can also be used in the context of any desired other optical applications, in particular imaging methods at different wavelengths, in which similar problems arise in terms of the deformation for correcting imaging errors.

Furthermore, the disclosure can be used in connection with the inspection of objects, such as for example so-called mask inspection, in which the masks used for microlithography are inspected for their integrity, etc. In FIG. 1, a sensor unit, for example, which detects the imaging of the projection pattern of the reticle 104.1 (for further processing), then takes the place of the wafer 105.1. This mask inspection can then take place substantially at the same wavelength as is used in the later microlithographic process. However, it is similarly possible also to use any desired wavelengths deviating therefrom for the inspection.

Finally, the present disclosure has been described above on the basis of specific exemplary embodiments showing specific combinations of the features defined in the following patent claims. It should expressly be pointed out at this juncture that the subject matter of the present disclosure is not restricted to these combinations of features, rather all other combinations of features such as are evident from the following patent claims also belong to the subject matter of the present disclosure.

What is claimed is:

1. An optical arrangement, comprising:
a holding device configured to hold an optical element, wherein:
the holding device comprises a holding element having first and second interface sections;
the first interface section defines a first interface by which the holding element, in an assembled state, is connected to the optical element;
the second interface section defines a second interface by which the holding element, in the assembled state, is connected to a support unit which is configured to connect the optical element to a support structure to support the optical element on the support structure via a supporting force;
the holding element is configured to be at least partially inserted into a cutout in the optical element;
the holding device comprises an actuator device which engages with the holding element between the first and second interfaces; and
the actuator device is configured to act, under control of a control device, on the holding element so that a definable interface deformation and/or a definable interface force distribution that acts on the optical element is set at the first interface.

2. The optical arrangement of claim 1, wherein:
the holding element defines a circumferential direction, a radial direction, and an axial direction;
the axial direction runs perpendicular to a plane defined by the circumferential direction and the radial direction;
the actuator device is configured to set, under control of the control device and in at least one peripheral region of the holding element, a definable radial interface force that acts in the radial direction on the optical element;
the actuator device comprises an actuator unit assigned to the at least one peripheral region; and
the actuator device is configured to set the radial interface force.

3. The optical arrangement of claim 2, wherein:
the holding element has a plurality of separate peripheral regions;
the actuator device is configured to set, under control of the control device, a definable radial interface force in each of the peripheral regions; and
for two of the peripheral regions, the actuator device is configured to: i) separately set the radial interface forces separately; ii) set radial interface forces that are at an angle with respect to one another; and/or iii) set radial interface forces that are at least substantially parallel to one another.

4. The optical arrangement of claim 1, wherein:
the holding element defines a circumferential direction, a radial direction, and an axial direction;
the axial direction runs perpendicular to a plane defined by the circumferential direction and the radial direction;
the actuator device is configured to set, under control of the control device and in at least one peripheral region of the holding element, a definable tangential interface force that acts tangentially to the circumferential direction on the optical element;
the actuator device comprises an actuator unit assigned to the at least one peripheral region; and
the actuator is configured to set the tangential interface force.

5. The optical arrangement of claim 4, wherein:
the holding element has a plurality of separate peripheral regions;
the actuator device is configured to set under control device control a definable tangential interface force in each of the peripheral regions; and
for two of the peripheral regions, the actuator is configured to: i) separately set the tangential interface forces; ii) set tangential interface forces that are at an angle with respect to one another; and/or iii) set tangential interface forces that are at least substantially parallel to one another.

6. The optical arrangement of claim 1, wherein:
the holding element defines a circumferential direction, a radial direction, and an axial direction;
the axial direction runs perpendicular to a plane defined by the circumferential direction and the radial direction;
the actuator device is configured to set, under control of the control device and in at least one peripheral region of the holding element, a definable axial interface force that acts parallel to the axial direction on the optical element;
the actuator device comprises an actuator unit assigned to the at least one peripheral region;
the actuator is configured to set the axial interface force.

7. The optical arrangement of claim 6, wherein:
the holding element has a plurality of separate peripheral regions;
the actuator device is configured to set, under control of the control device, a definable axial interface force in each of the peripheral regions; and
for two of the peripheral regions, the actuator device is configured to: i) separately set the axial interface forces; and/or ii) set axial interface forces that are at least substantially opposite to one another.

8. The optical arrangement of claim 1, wherein:
the holding element defines a circumferential direction, a radial direction, and an axial direction;
the axial direction runs perpendicular to a plane defined by the circumferential direction and the radial direction;
the actuator device is configured to set, under control of the control device and in at least one peripheral region of the holding element, at least one definable interface moment that acts on the optical element;
at least one of the following holds:
the actuator device comprises an actuator unit assigned to the at least one peripheral region, and the actuator device is configured to set the at least one interface moment;
the at least one interface moment acts in the circumferential direction;
the at least one interface moment acts in the axial direction; and
the at least one interface moment acts in the radial direction.

9. The optical arrangement of claim 8, wherein:
the holding element has a plurality of separate peripheral regions;

the actuator device is configured to set, under control of the control device, at least one definable interface moment in each of the peripheral regions; and for two of the peripheral regions, the actuator device is configured to: i) separately set the interface moments; ii) set interface moments that are at an angle with respect to one another; and/or iii) set interface moments that are at least substantially opposite to one another.

10. The optical arrangement of claim 1, wherein:
the holding element has a plurality of separate peripheral regions;
the actuator device comprises an assigned actuator unit for each of the peripheral regions; and
at least one of the following holds:
the plurality of separate peripheral regions comprises from three to 60 separate peripheral regions;
two of the peripheral regions are adjacent to one another; and
the peripheral regions define a center of the holding element and two of the peripheral regions are arranged diametrically opposite one another in relation to the center.

11. The optical arrangement of claim 1, wherein:
the holding element has a plurality of separate peripheral regions;
the actuator device comprises a plurality of actuator units which act on at least one of the peripheral regions; and
at least one of the following holds:
at least two actuator units are assigned to at least one peripheral region;
at least two actuator units act kinematically in series with one another on the same peripheral region;
at least two actuator units act kinematically in parallel with one another on the same peripheral region;
at least two actuator units act on the same peripheral region, the at least two actuator units, under control of the control device: i) set definable interface forces that act in different directions on the optical element; ii) set a definable interface force that acts on the optical element and a definable interface moment that acts on the optical element; and/or iii) set definable interface moments that act in different directions on the optical element.

12. The optical arrangement of claim 1, wherein:
the actuator device comprises an actuator unit configured to act on the holding element via at least one intermediate element; and
at least one of the following holds:
the intermediate element is connected to the first interface section in a region of a first end and to the actuator unit in a region of a second end;
the intermediate element comprises a movement reduction element;
the intermediate element comprises a lever element; and
the intermediate element comprises a spring element.

13. The optical arrangement of claim 1, wherein:
the actuator device comprises an actuator unit configured to act on the holding element between the first and second interfaces; and
at least one of the following holds:
the actuator unit is connected at one end to the first interface section; and
the actuator unit is connected at one end to the second interface section.

14. The optical arrangement of claim 1, wherein:
the actuator device comprises an actuator unit
the actuator unit comprises an active element; and at least one of the following holds:
the active element comprises a displacement actuator;
the active element comprises a linear actuator;
the active element comprises a shear actuator;
the active element is suppliable with electrical energy;
the active element is suppliable with thermal energy; and
the active element is suppliable with magnetic energy.

15. The optical arrangement of claim 1, wherein at least one of the following holds:
the holding element is configured so that the first interface is connected to a wall of the cutout of the optical element;
the holding element is designed at least section-wise in a region of the first interface section in the manner of a bushing, a plurality of peripheral regions are separated from one another by slots, and at least one of the peripheral regions is resilient in a radial direction of the bushing;
the holding element is designed at least section-wise in the manner of a bushing defining a central region of the holding element, and the second interface section is arranged in the central region of the holding element; and
the holding element is at least section-wise connected to the optical element via a material connection.

16. An optical imaging device, comprising:
an illumination device comprising a first optical element group, the illumination device configured to illuminate an object; and
a projection device comprising a second optical element group, the projection device configured to project an image of the object onto an image device,
wherein the illumination device and/or the projection device comprises an optical arrangement according to claim 1.

17. The optical imaging device of claim 16, further comprising a detection device and a control device, wherein:
the detection device is connected to the control device to detect a current imaging error of the imaging device;
the control device is configured to control the actuator device to correct the imaging error on the basis of the current imaging error; and
the control device is configured to use stored influence information representative of an influence of an actuation of the actuator device on the imaging error of the imaging device.

18. The optical imaging device of claim 16, further comprising first and second components provided in an imaging beam path from the illumination device to the image device, wherein:
the first component defines an image field of the projection on the image device;
the second component defines a pupil of the imaging device; and
at least one of the following holds:
the optical arrangement is in the imaging beam path closely adjacent to the first component;
the optical arrangement is in the imaging beam path closely adjacent to the second component; and
the optical arrangement is arranged in the imaging beam path in a region of an intermediate position remote from the first and second components.

19. A method for supporting a microlithographic optical element, the optical element being held by a holding device comprising a holding element which comprises first and second interface sections, the first interface section defining a first interface by which the holding element in an assembled state is connected to the optical element, the second interface section defining a second interface by which the holding element in the assembled state is connected to a support unit which connects the optical element to a support structure to support the optical element on the support structure by way of a supporting force, an actuator device of the holding device engaging the holding element between the first and second interfaces, the method comprising:

controlling the actuator device so that the actuator device acts on the holding element so that, at the first interface, a definable interface deformation and/or a definable interface force distribution that acts on the optical element is set.

20. The method of claim 19, further comprising:

using an illumination device comprising a first optical element group to illuminate an object;

using a projection device comprising a second optical element group to project an image of the object onto an image device;

controlling a current imaging error of the projection is detected and the actuator device to correct the imaging error on the basis of the current imaging error; and using stored influence information representative of an influence of an actuation of the actuator device on the imaging error.

* * * * *

UNITED STATES PATENT AND TRADEMARK OFFICE
CERTIFICATE OF CORRECTION

| | | |
|---|---|---|
| PATENT NO. | : 12,271,117 B2 | Page 1 of 1 |
| APPLICATION NO. | : 18/296186 | |
| DATED | : April 8, 2025 | |
| INVENTOR(S) | : Toralf Gruner and Joachim Hartjes | |

It is certified that error appears in the above-identified patent and that said Letters Patent is hereby corrected as shown below:

On the Title Page

Item [57], Line 4, delete "for" and insert -- forms --.

In the Specification

Column 11, Line 38, after "line" insert -- III-III --.

Column 13, Line 52, after "goes" delete "is".

Column 22, Line 39, delete "n a" and insert -- in a --.

In the Claims

Column 29, Line 66, in Claim 14, after "unit" insert -- ; --.

Signed and Sealed this
Twentieth Day of May, 2025

Coke Morgan Stewart
*Acting Director of the United States Patent and Trademark Office*